(12) United States Patent
Lu

(10) Patent No.: US 10,299,380 B1
(45) Date of Patent: May 21, 2019

(54) FASTENING DEVICE FOR JOINING CIRCUIT BOARDS AND ELECTRONIC DEVICE USING SAME

(71) Applicant: HONGFUJIN PRECISION ELECTRONICS (TIANJIN) CO., LTD., Tianjin (CN)

(72) Inventor: Wen-Hu Lu, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 15/960,659

(22) Filed: Apr. 24, 2018

(30) Foreign Application Priority Data

Mar. 15, 2018 (CN) .......................... 2018 1 0213608

(51) Int. Cl.
*H05K 1/14* (2006.01)
*G06F 1/18* (2006.01)

(52) U.S. Cl.
CPC ............ *H05K 1/144* (2013.01); *G06F 1/184* (2013.01); *H05K 2201/042* (2013.01); *H05K 2201/1031* (2013.01); *H05K 2201/10189* (2013.01); *H05K 2201/10393* (2013.01); *H05K 2201/10424* (2013.01); *H05K 2201/2018* (2013.01); *H05K 2201/2072* (2013.01)

(58) Field of Classification Search
CPC .... H05K 1/14; G06F 1/14; G06F 1/16; G06F 1/184–1/187; G06F 1/1616

USPC ......... 361/755, 737, 754, 679.33, 786, 802; 439/65, 162

See application file for complete search history.

(56) References Cited

U.S. PATENT DOCUMENTS

| | | | | |
|---|---|---|---|---|
| 3,784,954 A * | 1/1974 | Grimm | ............ | H01R 13/62933 439/65 |
| 5,299,089 A * | 3/1994 | Lwee | .................... | G06F 1/184 361/679.33 |
| 5,724,210 A * | 3/1998 | Sawada | ................ | G11B 17/051 360/99.02 |
| 6,172,867 B1 * | 1/2001 | Satou | ..................... | G06F 1/1616 312/223.1 |
| 2012/0033388 A1 * | 2/2012 | Peng | ..................... | G06F 1/185 361/737 |

* cited by examiner

*Primary Examiner* — Xiaoliang Chen
(74) *Attorney, Agent, or Firm* — ScienBiziP, P.C.

(57) ABSTRACT

An electronic device includes a first and second printed boards, a bottom plate fixed to first printed board, first and second rotating arms, and an electronic member. The first rotating arm has first and second ends and the second rotating arm includes third and fourth ends. The first and third ends are rotatably fixed to the bottom plate. The fourth end defines a sliding groove into which the second end is slidably fixed. When the second end rotates around the first end toward the bottom plate, the second end slides along the sliding groove and the third end rotates toward the bottom plate. An elastic member is between the first rotating arm and the bottom plate and when the first rotating arm rotates, the elastic member abuts against the bottom plate to drive the first printed board to move toward the second printed board.

20 Claims, 5 Drawing Sheets

FASTENING DEVICE FOR JOINING CIRCUIT BOARDS AND ELECTRONIC DEVICE USING SAME

FIELD

The subject matter herein generally relates to electronic connections.

BACKGROUND

Computers may include a first motherboard and a second motherboard. The first motherboard communicates with the second motherboard through multiple pairs of connectors. Each connector has a plurality of pins, and it takes time and effort to connect the second motherboard to the first motherboard.

BRIEF DESCRIPTION OF THE DRAWINGS

Implementations of the present technology will now be described, by way of example only, with reference to the attached figures.

DETAILED DESCRIPTION

Figure 1:
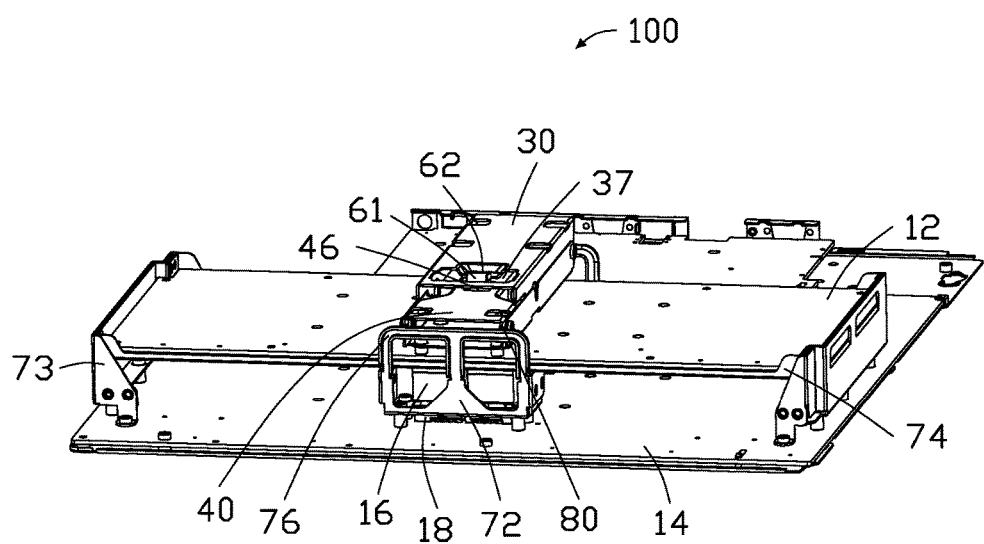
FIG. 1 is an isometric view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein. The disclosure is illustrated by way of example and not by way of limitation in the figures of the accompanying drawings, in which like references indicate similar elements. It should be noted that references to "an" or "one" exemplary embodiment in this disclosure are not necessarily to the same exemplary embodiment, and such references mean "at least one."

The term "comprising" means "including, but not necessarily limited to"; it specifically indicates open-ended inclusion or membership in a so-described combination, group, series, and the like.

Figure 2:
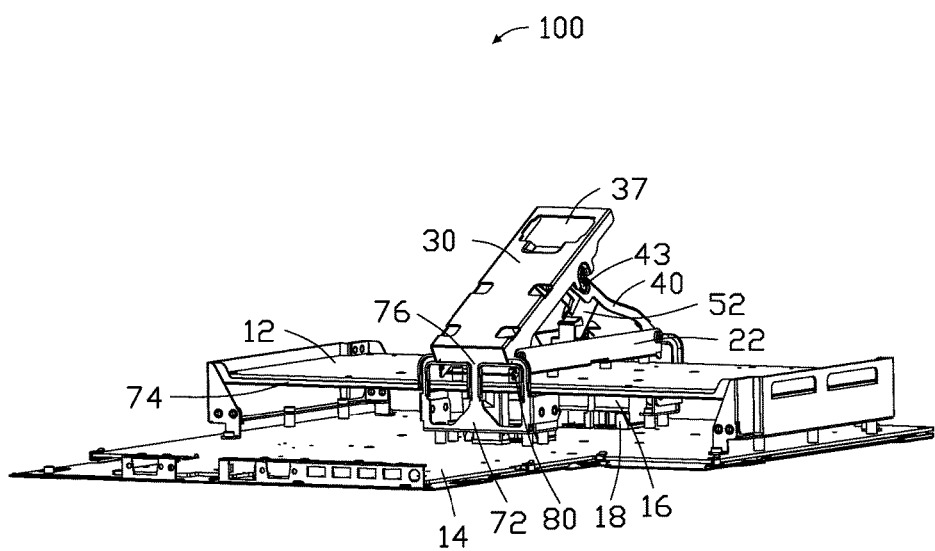
FIG. 2 is an isometric view of the electronic device in FIG. 1 with a fastening device not securing a first connector to a second connector.
Figure 3:
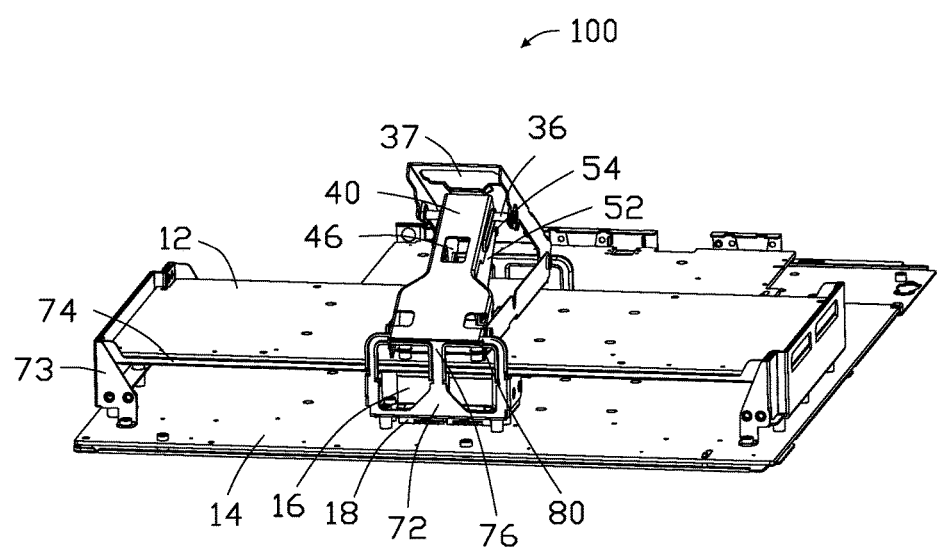
FIG. 3 is similar to FIG. 2, but viewed from another direction.

FIG. 1 to FIG. 3 illustrate an electronic device 100 including a first printed board 12, a second printed board 14, and a fastening device 20 to connect between them. The first printed board 12 includes at least one first connector 16. The second printed board 14 includes at least one second connector 18. The fastening device 20 is fixed to the first printed board 12 and is configured to fix the at least one first connector 16 to the at least one second connector 18.

Figure 4:
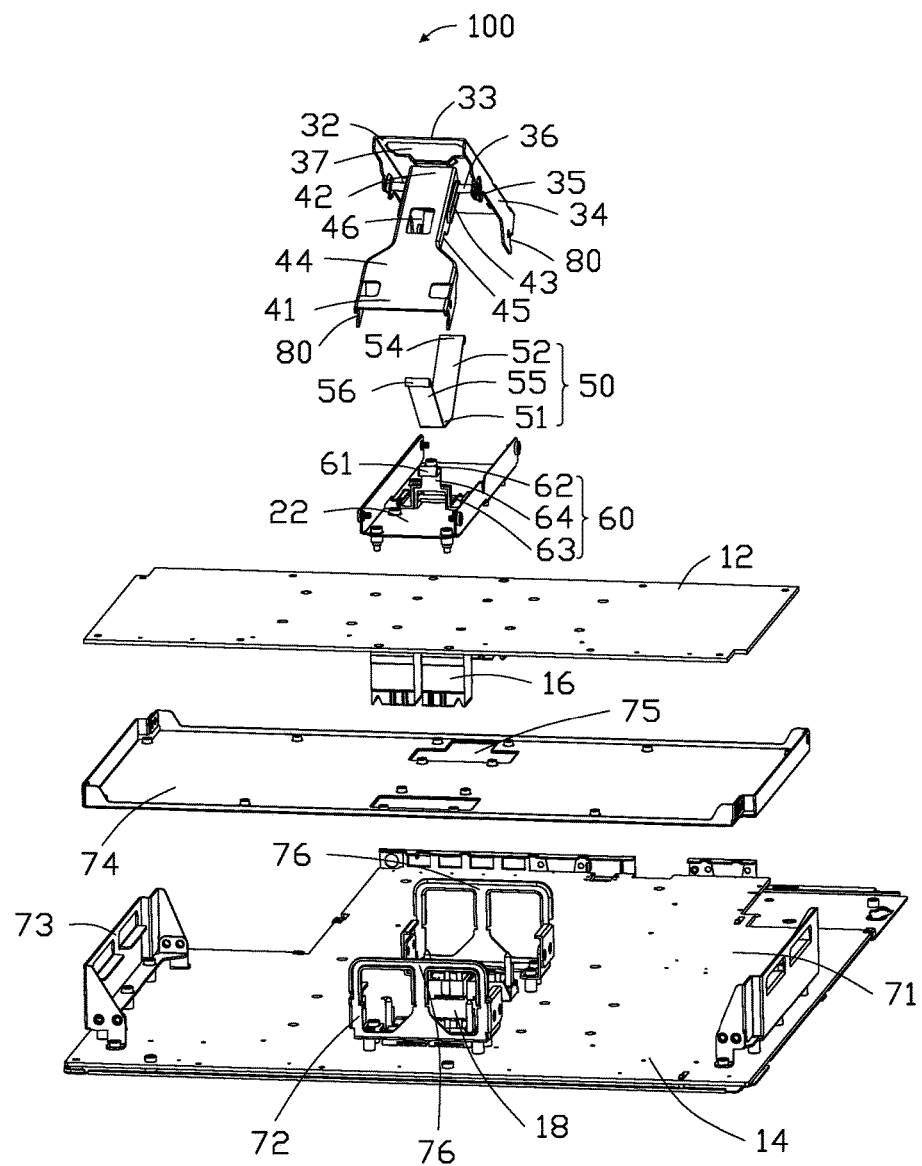
FIG. 4 is an exploded view of the electronic device of FIG. 2.
Figure 5:
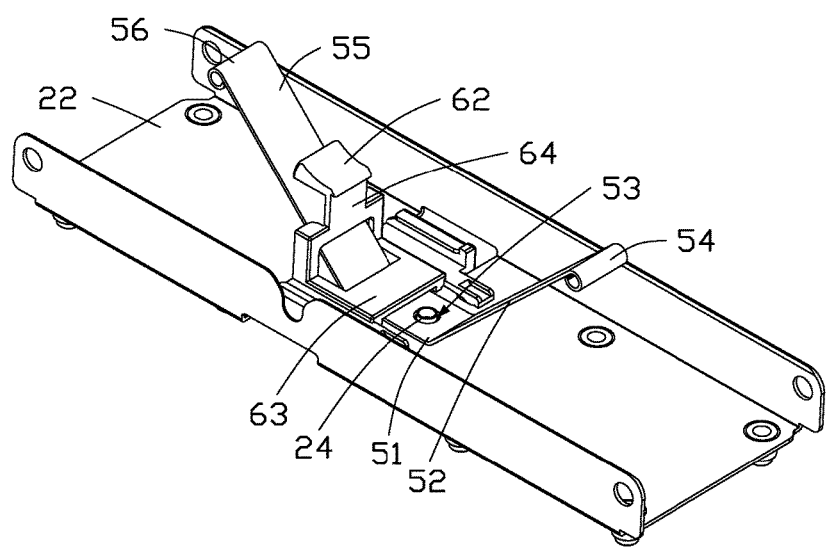
FIG. 5 is an isometric view of a buckle with an elastic member of the device of FIG. 2.

FIGS. 4 and 5 illustrate the fastening device 20 which includes a bottom plate 22, a first rotating arm 30, a second rotating arm 40, and an electronic member 50. The first rotating arm 30 includes a first end 31 and a second end 32. The second rotating arm 40 includes a third end 41 and a fourth end 42. The first end 31 and the third end 41 are rotatably fixed to the bottom plate 22. The fourth end 42 defines a sliding groove 43. The second end 32 is slidably fixed in the sliding groove 43. The bottom plate 22 is fixed to the first printed board 12. When the second end 31 rotates around the first end 31 toward the bottom plate 22, the second end 32 slides along the sliding groove 43 and the third end 41 rotates around the fourth end 42 toward the bottom plate 22. The elastic member 50 is positioned between the first rotating arm 30 and the bottom plate 22. When the first rotating arm 30 rotates toward the bottom plate 22, the elastic member 50 abuts against the bottom plate 22 to drive the first connector 16 to move toward the second connector 18 and fix the first connector 16 to the second connector 18.

The first rotating arm 30 includes a first rotating plate 33 and two first fixing pieces 34 extending from two opposite sides of the first rotating piece 33 toward the bottom plate 22. Each of the first fixing pieces 34 defines a fixing hole 35. A fixing shaft 36 passes thorough the sliding groove 43 and is fixed in the two fixing holes 35. The second rotating arm 40 includes a second rotating piece 44 and two second fixing piece 45 extending from the two opposite sides of the second rotating piece 44 toward the bottom plate 22. Each of the second fixing pieces 45 defines one sliding groove 43.

The fastening device 20 further includes an elastic buckle 60. The buckle 60 is fixed to the bottom plate 22. The second end 32 defines a first through hole 37. The fourth end 42 defines a second through hole 46. When the second end 32 rotates to a preset position, the buckle 60 passes through the second hole 46 and the first hole 37 and is locked on an edge of the first through hole 37. When the buckle 60 is locked on the edge of the first through hole 37, the first rotating arm 30 is parallel to the bottom plate 22.

The buckle 60 includes a resilient portion 62 perpendicular to the bottom plate 22 and a latching portion 64 extending from an end of the resilient portion 62 away from the bottom plate 22. The latching portion 64 includes a wedge surface 61 facing the third end 41. The wedge surface 61 is pressed against the edges of the second through hole 46 and the first through hole 37 to deform the elastic portion 62. This permits the wedge surface 61 to pass through the first through hole 37 and the second through hole 46. When the wedge surface 61 passes through the second through hole 46, the elastic portion 62 is reset so that the latching portion 64 is engaged with the edge of the first through hole 37. The buckle 60 further includes a fixing portion 63 connected to an end of the elastic portion 62 near the bottom plate 22. The fixing portion 63 is parallel to the bottom plate 22 and is fixed to the bottom plate 22.

The elastic member 50 includes a resisting piece 51 and a first resisting arm 52 obliquely extended from one end of the resisting piece 51 toward the first end 31. The resisting piece 51 is positioned between the bottom plate 22 and the fixing portion 63. A positioning post 24 protrudes from the bottom plate 22. The resisting piece 51 defines a positioning hole 53. The positioning post 24 is positioned in the positioning hole 53. One end of the first resisting arm 52 away from the bottom plate 22 is bent to form a first arcuate surface 54. The first arcuate surface 54 abuts against the first rotating arm 30. The elastic member 50 further includes a second resisting arm 55 obliquely extended from the other end of the resisting piece 51 toward the third end 41. One end of the second resisting arm 55 away from the bottom plate 22 is bent to form a second arcuate surface 56. The second arcuate surface 56 abuts against the second rotating arm 40.

The electronic device 100 further includes a positioning frame 70. The positioning frame 70 is fixedly connected to the second circuit board 14. The positioning frame 70 defines a receiving space 71 for accommodating the first circuit board 12, and for facilitating alignment between the first connector 16 and the second connector 18. The positioning frame 70 includes two opposite first fixing frames 72 and two opposite second fixing frames 73. The two first fixing frames 72 and the two second fixing frames 73 are respectively disposed on the four sides of the first circuit board 12. The electronic device 100 further includes an iron piece 74 fixedly connected to the first circuit board 12. The iron piece 74 defines a receiving hole 75. The first connector 16 passes through the receiving hole 75 and connects to the second connector 18.

The first end 31 and the third end 41 each defines a positioning slot 80. Each first fixing frames 72 includes a positioning piece 76. The positioning piece 76 is disposed in the positioning groove 80. When the first rotating arm 30 and the second rotating arm 40 rotate, the first end 31 and the third end 41 also rotate around the positioning piece 76.

The exemplary embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A fastening device comprising:
   a bottom plate configured to fixed to a first circuit board having at least one connector;
   a first rotating arm comprising a first end and a second end;
   a second rotating arm comprising a third end and a fourth end both, the fourth end defining a sliding groove; and
   an elastic member positioned between the first rotating arm and the bottom plate;
   wherein the first end and the third end are rotatably fixed to the bottom plate, the second end is slidably fixed in the sliding groove, when the second end rotates around the first end toward the bottom plate, the second end slides along the sliding groove and the third end rotates around the fourth end toward the bottom plate; when the first rotating arm rotates toward the bottom plate, the elastic member abuts against the bottom plate to drive the first connector to move toward a second connector positioned on a second printed board.

2. The fastening device as claimed in claim 1, further comprising an elastic buckle, the buckle is fixed to the bottom plate, the second end defines a first through hole, the fourth end defines a second through hole, when the second end rotates to a preset position, the buckle passes through the second hole and the first hole and is locked on an edge of the first through hole.

3. The fastening device as claimed in claim 2, wherein when the buckle is locked on the edge of the first through hole, the first rotating arm is parallel to the bottom plate.

4. The fastening device as claimed in claim 2, wherein the buckle comprises a resilient portion perpendicular to the bottom plate and a latching portion extending from an end of the resilient portion away from the bottom plate, the latching portion comprises a wedge surface facing the third end, the wedge surface is pressed against the edges of the second through hole and the first through hole to deform the elastic portion so that the wedge surface passes through the first through hole and the second through hole, when the wedge surface passes through the second through hole, the elastic portion is reset so that the latching portion is engaged with the edge of the first through hole.

5. The fastening device as claimed in claim 4, wherein the buckle further comprises a fixing portion connected to an end of the elastic portion near the bottom plate, the fixing portion is parallel to the bottom plate and is fixed to the bottom plate, the elastic member comprises a resisting piece and a first resisting arm obliquely extended from one end of the resisting piece toward the first end, the resisting piece is positioned between the bottom plate and the fixing portion, one end of the first resisting arm away from the bottom plate is bent to form a first arcuate surface, the first arcuate surface abuts against the first rotating arm.

6. The fastening device as claimed in claim 5, wherein the elastic member further comprises a second resisting arm obliquely extended from the other end of the resisting piece toward the third end, one end of the second resisting arm away from the bottom plate is bent to form a second arcuate surface, the second arcuate surface abuts against the second rotating arm.

7. The fastening device as claimed in claim 5, wherein a positioning post protrudes from the bottom plate, the resisting piece defines a positioning hole, the positioning post is positioned in the positioning hole.

8. The fastening device as claimed in claim 7, wherein the first rotating arm comprises a first rotating plate and two first fixing piece extending from two opposite sides of the first rotating piece toward the bottom plate, each of the first fixing piece defines a fixing hole, a fixing shaft passes thorough the sliding groove and is fixed in the two fixing holes.

9. The fastening device as claimed in claim 7, wherein the second rotating arm comprises a second rotating piece and two second fixing piece extending from the two opposite sides of the second rotating piece toward the bottom plate, each of the second fixing piece defines one of the sliding groove.

10. An electronic device comprising:
    a first circuit board comprising at least one first connector;
    a second circuit board comprising at least one second connector
    a bottom plate fixed to the first circuit board;
    a first rotating arm comprising a first end and a second end;
    a second rotating arm comprising a third end and a fourth end both, the fourth end defining a sliding groove; and
    an elastic member positioned between the first rotating arm and the bottom plate;
    wherein the first end and the third end are rotatably fixed to the bottom plate, the second end is slidably fixed in the sliding groove, when the second end rotates around the first end toward the bottom plate, the second end slides along the sliding groove and the third end rotates around the fourth end toward the bottom plate; when the first rotating arm rotates toward the bottom plate, the elastic member abuts against the bottom plate to drive the first connector to move toward the second connector.

11. The electronic device as claimed in claim 10, further comprising an elastic buckle, the buckle is fixed to the bottom plate, the second end defines a first through hole, the fourth end defines a second through hole, when the second end rotates to a preset position, the buckle passes through the second hole and the first hole and is locked on an edge of the first through hole.

12. The electronic device as claimed in claim 11, wherein when the buckle is locked on the edge of the first through hole, the first rotating arm is parallel to the bottom plate.

13. The electronic device as claimed in claim 11, wherein the buckle comprises a resilient portion perpendicular to the bottom plate and a latching portion extending from an end of the resilient portion away from the bottom plate, the latching portion comprises a wedge surface facing the third end, the wedge surface is pressed against the edges of the second through hole and the first through hole to deform the elastic portion so that the wedge surface passes through the first through hole and the second through hole, when the wedge surface passes through the second through hole, the elastic portion is reset so that the latching portion is engaged with the edge of the first through hole.

14. The electronic device as claimed in claim 13, wherein the buckle further comprises a fixing portion connected to an end of the elastic portion near the bottom plate, the fixing portion is parallel to the bottom plate and is fixed to the bottom plate, the elastic member comprises a resisting piece and a first resisting arm obliquely extended from one end of the resisting piece toward the first end, the resisting piece is positioned between the bottom plate and the fixing portion, one end of the first resisting arm away from the bottom plate is bent to form a first arcuate surface, the first arcuate surface abuts against the first rotating arm.

15. The electronic device as claimed in claim 14, wherein the elastic member further comprises a second resisting arm obliquely extended from the other end of the resisting piece toward the third end, one end of the second resisting arm away from the bottom plate is bent to form a second arcuate surface, the second arcuate surface abuts against the second rotating arm.

16. The electronic device as claimed in claim 14, wherein a positioning post protrudes from the bottom plate, the resisting piece defines a positioning hole, the positioning post is positioned in the positioning hole.

17. The electronic device as claimed in claim 16, wherein the first rotating arm comprises a first rotating plate and two first fixing piece extending from two opposite sides of the first rotating piece toward the bottom plate, each of the first fixing piece defines a fixing hole, a fixing shaft passes thorough the sliding groove and is fixed in the two fixing holes.

18. The electronic device as claimed in claim 16, wherein the second rotating arm comprises a second rotating piece and two second fixing piece extending from the two opposite sides of the second rotating piece toward the bottom plate, each of the second fixing piece defines one of the sliding groove.

19. The electronic device as claimed in claim 10, further comprises a positioning frame, the positioning frame is fixedly connected to the second circuit board, the positioning frame defines a receiving space for accommodating the first circuit board.

20. The electronic device as claimed in claim 19, further comprises an iron piece fixedly connected to the first circuit board, the iron piece defines a receiving hole, the first connector passes through the receiving hole and connects to the second connector.

* * * * *